United States Patent
Sohda et al.

(10) Patent No.: US 8,735,814 B2
(45) Date of Patent: May 27, 2014

(54) ELECTRON BEAM DEVICE

(75) Inventors: Yasunari Sohda, Kawasaki (JP); Takeyoshi Ohashi, Tokyo (JP); Tasuku Yano, Hitachi (JP); Muneyuki Fukuda, Kokubunji (JP); Noritsugu Takahashi, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/879,051

(22) PCT Filed: Oct. 5, 2011

(86) PCT No.: PCT/JP2011/072941
§ 371 (c)(1),
(2), (4) Date: Jun. 14, 2013

(87) PCT Pub. No.: WO2012/050018
PCT Pub. Date: Apr. 19, 2012

(65) Prior Publication Data
US 2013/0270435 A1     Oct. 17, 2013

(30) Foreign Application Priority Data
Oct. 15, 2010   (JP) .................. 2010-232630

(51) Int. Cl.
*G01N 23/00*   (2006.01)
*G21K 7/00*   (2006.01)

(52) U.S. Cl.
USPC ........... 250/306; 250/307; 250/310; 250/311; 250/441.11; 250/492.2; 250/398; 250/396 R

(58) Field of Classification Search
USPC ......... 250/306, 307, 310, 311, 441.11, 492.2, 250/398, 396 R
See application file for complete search history.

(56) References Cited

U.S. PATENT DOCUMENTS 6,614,026 B1 * 9/2003 Adamec .................. 250/398
2001/0010357 A1   8/2001 Ose et al.
(Continued)

FOREIGN PATENT DOCUMENTS

| JP | 2001-015055 A | 1/2001 |
| JP | 2001-023558 A | 1/2001 |
| JP | 2003-332206 A | 11/2003 |
| JP | 2005-063983 A | 3/2005 |

(Continued)

OTHER PUBLICATIONS

Rev. Sci. Instrum., vol. 64, No. 3, Mar. 1993, pp. 659-666.

*Primary Examiner* — Jack Berman
*Assistant Examiner* — Meenakshi Sahu
(74) *Attorney, Agent, or Firm* — Mattingly & Malur, PC

(57) ABSTRACT

The electron beam device includes a source of electrons and an objective deflector. The electron beam device obtains an image on the basis of signals of secondary electrons, etc. which are emitted from a material by an electron beam being projected. The electron beam device further includes a bias chromatic aberration correction element, further including an electromagnetic deflector which is positioned closer to the source of the electrons than the objective deflector, and an electrostatic deflector which has a narrower interior diameter than the electromagnetic deflector, is positioned within the electromagnetic deflector such that the height-wise position from the material overlaps with the electromagnetic deflector, and is capable of applying an offset voltage. It is thus possible to provide an electron beam device with which it is possible to alleviate geometric aberration (parasitic aberration) caused by deflection and implement deflection over a wide field of view with high resolution.

16 Claims, 14 Drawing Sheets

(56) References Cited

U.S. PATENT DOCUMENTS

| | | |
|---|---|---|
| 2003/0209674 A1* | 11/2003 | Hamaguchi et al. ... 250/396 ML |
| 2004/0227081 A1 | 11/2004 | Sato et al. |
| 2005/0139773 A1 | 6/2005 | Ose et al. |
| 2007/0057186 A1* | 3/2007 | Nakasuji et al. ............. 250/310 |
| 2007/0158563 A1* | 7/2007 | Goto ............................ 250/310 |
| 2009/0212228 A1 | 8/2009 | Hirose et al. |

FOREIGN PATENT DOCUMENTS

| | | |
|---|---|---|
| JP | 2006-221870 A | 8/2006 |
| JP | 2006-277996 A | 10/2006 |
| JP | 2007-035386 A | 2/2007 |
| JP | 3932894 B2 | 3/2007 |
| JP | 2007-188937 A | 7/2007 |
| JP | 2009-199904 A | 9/2009 |

* cited by examiner

ELECTRON BEAM DEVICE

TECHNICAL FIELD

The present invention relates to an electron beam device which is used for inspection and measurement.

BACKGROUND ART

A scanning electron microscope (SEM) using an electron beam which is used to observe, inspect and measure a sample accelerates electrons emitted from an electron source and irradiates the electron so as to be converged on a surface of the sample using an electrostatic or electromagnetic lens. The electrons may be called as primary electrons. When the primary electron is incident, secondary electrons or reflection electrons may be generated from the sample. The secondary electrons or the reflection electrons are detected while scanning the electron beam so as to be deflected to obtain a minute pattern on the sample or a scanning image of composition distribution. Further, electrons which are absorbed onto the sample are detected to form an absorbed current image.

As a desirable function of the scanning electron microscope, there is a function of performing scanning with a wide viewing field without causing the significant lowering of a resolution of the electron beam. As the miniaturization of a semiconductor is progressed, a two-dimensional high speed inspection of a resist pattern is required and scanning with a wide viewing field is required in order to expand an inspection area and lower a shrinkage.

In order to achieve the above object, it is required to reduce a deflected chromatic aberration which is generated by the deflection of the electron beam. As an implementing method thereof, Patent Literature 1 and Patent Literature 2 suggest to use an electron optical element represented as E×B in which an electromagnetic deflector and an electrostatic deflector are combined. The E×B element is also used as a part of an energy filter of the electron beam or a deflecting element of the secondary electrons, which is disclosed in Patent Literature 3, Patent Literature 4, and Patent Literature 5 and Non-Patent Literature 1.

CITATION LIST

Patent Literature

Patent Literature 1: Japanese Patent No. 03932894
Patent Literature 2: Japanese Patent Application Laid-Open Publication No. 2001-15055
Patent Literature 3: Japanese Patent Application Laid-Open Publication No. 2001-23558
Patent Literature 4: Japanese Patent Application Laid-Open No. 2007-35386
Patent Literature 5: Japanese Patent Application Laid-Open Publication No. 2006-277996

Non-Patent Literature

Non-Patent Literature 1: Rev. Sci. Instrum., Vol. 64, No. 3, March 1993 p 659-p 666

SUMMARY OF INVENTION

Technical Problem

However, in the related art, the following various problems occurring when the E×B element is used to correct the deflected chromatic aberration have not been considered. That is, (1) in correction of the deflected chromatic aberration, the deflection is significant in the electromagnetic deflection and the electrostatic deflection so that a voltage source having a high voltage and a current source having a high current are required, which may cause a response delay in deflection depending dynamic correction. (2) Geometric aberration (hereinafter, referred to as a parasitic aberration) which is caused by the increase of the deflection field is increased. (3) Due to a mechanical manufacturing and assembling error, deflection points of an electromagnetic deflector and an electrostatic deflector do not match to each other and a parasitic aberration similarly to (2) occurs. (4) An adjusting means of the E×B element which satisfies a requirement of high correction precision is not established.

A first object of the present invention is to provide an electron beam device which is capable of suppressing the parasitic aberration caused by the response delay or deflection even when the deflected chromatic aberration is corrected and achieving the deflection with a wide viewing field at a high resolution.

A second object of the present invention is to provide an electron beam device which is capable of suppressing the parasitic aberration caused by the manufacturing process and achieving the deflection with a wide viewing field at a high resolution.

A third object of the present invention is to provide an electron beam device which is capable of easily adjusting an E×B element.

A fourth object of the present invention is to provide an electron beam device which is capable of suppressing the parasitic aberration caused by deflection and the parasitic aberration caused by the manufacturing process.

Solution to Problem

In order to achieve the first object, (1) an electromagnetic deflector is provided above a deflector which defines a position of an electron beam on a sample and an electrostatic deflector having a smaller inner diameter than the electromagnetic deflector, which is capable of applying an offset voltage, is provided so as to overlap the electromagnetic deflector.

In order to achieve the second object, (2) any one of the electromagnetic deflector and the electrostatic deflector is configured to have a double stage structure.

In order to achieve the third object, (3) the electromagnetic deflector and the electrostatic deflector are provided above a lens which is provided above an objective deflector which defines a position of the electron beam.

In order to achieve the fourth object, (4) a means of automatically measuring a change in a position of the beam or a change in a deflected amount (scanning magnification) of a deflector which defines the position and the deflecting direction (rotation of the scanning area) when intensities of the deflectors are simultaneously and minutely changed or a voltage of an electron source is minutely changed or (5) the electrostatic deflector functions as both astigmatism corrector and a focal point corrector.

Advantageous Effects of Invention

According to the present invention, it is possible to correct the deflected chromatic aberration with a high sensitivity, reduce or correct the parasitic aberration, and achieve deflection with a wide viewing field while maintaining the high resolution.

DESCRIPTION OF EMBODIMENTS

Hereinafter, embodiments will be described.

First Embodiment

Figure 10:
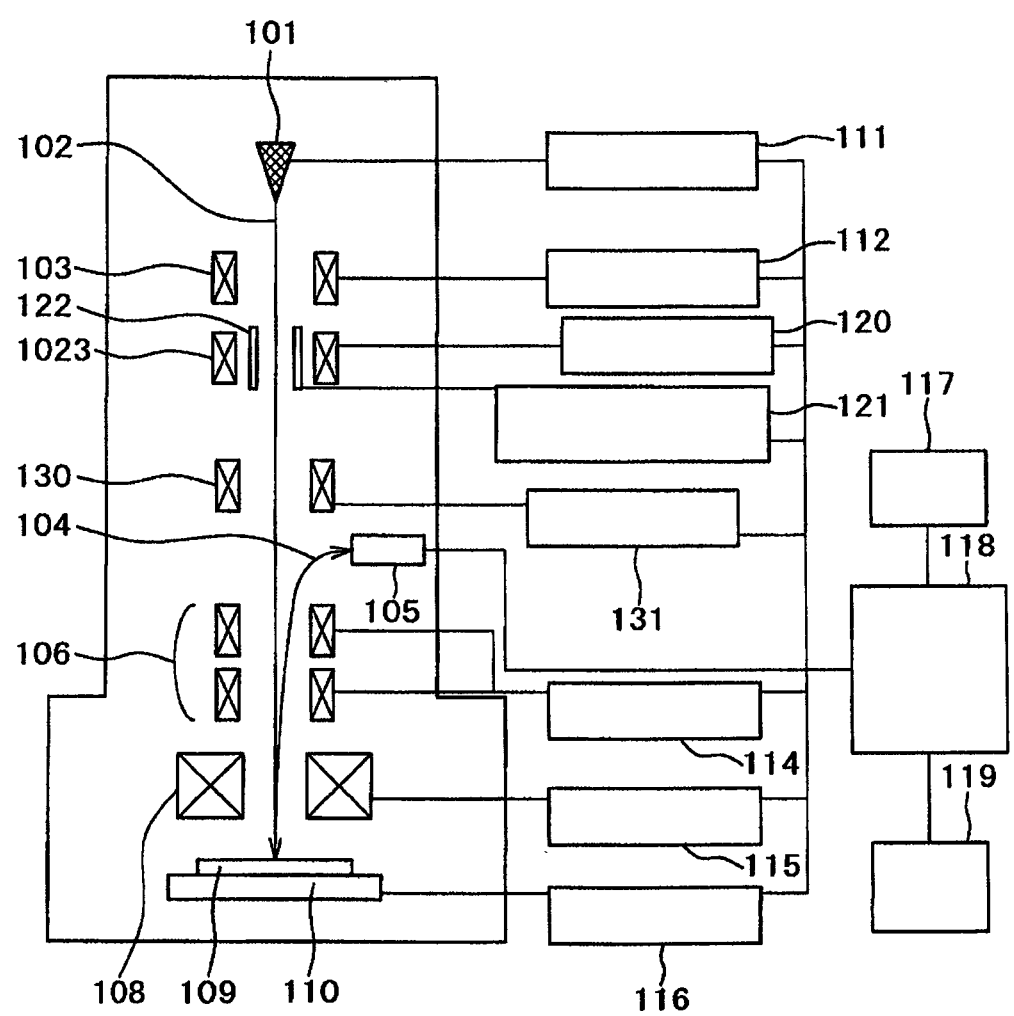
FIG. 10 is a schematic overall configuration view of an electron beam device (scanning electron microscope) according to the first embodiment.

A first embodiment will be described with reference to FIGS. 8, and 10 to 13. FIG. 10 is an overall schematic view of an electron beam device (scanning electron microscope) according to the embodiment. An electron beam 102 emitted from an electron gun 101 is focused on a sample by a first condenser lens 103, a second condenser lens 130, and an objective lens 108. Secondary electrons or reflection electrons 104 emitted from the sample are detected by a detector 105 which is disposed at the center. The electron beam on the sample is two-dimensionally scanned by an objective deflector 106 to obtain a two-dimensional image as a result. The two-dimensional image is displayed on a display device 119. In a scanning electron microscope according to the embodiment, an electromagnetic deflector 1023 and an electrostatic deflector 122 which suppress a deflected chromatic aberration are disposed above the objective deflector 106 which defines a position on the sample and the second condenser lens 130 so that height positions from the sample overlap in a concentric circle shape. Further, reference numeral 109 denotes a sample, reference numeral 110 denotes a holder (stage), reference numeral 111 denotes an electron gun controller, reference numeral 112 denotes a first condenser lens controller, reference numeral 114 denotes a scanning deflector controller, reference numeral 115 denotes an electromagnetic lens controller, reference numeral 116 denotes a sample voltage controller, reference numeral 117 denotes a storage device, reference numeral 118 denotes a control operating unit of the overall device, reference numeral 120 denotes an electromagnetic deflector controller, reference numeral 121 denotes an offset applied electrostatic deflector controller, and reference numeral 131 denotes a second condenser lens controller.

Figure 11:
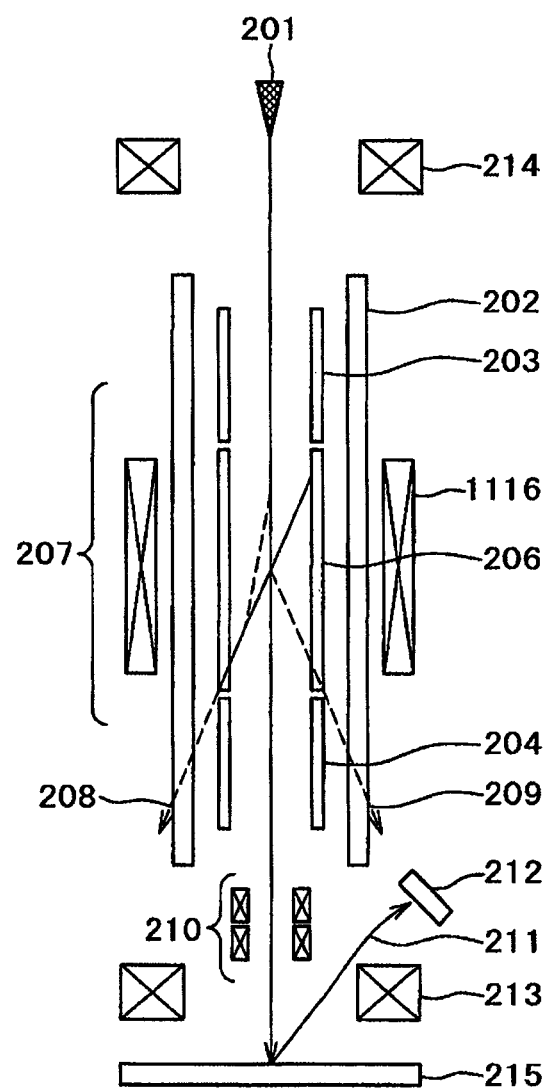
FIG. 11 is a schematic cross-sectional view illustrating a main part of an electrooptical configuration of an electron beam device (scanning electron microscope) according to the first embodiment.

Further, FIG. 11 illustrates one part of an electrooptic configuration in the scanning electron microscope in detail. As illustrated in FIG. 11, a deflected chromatic aberration correcting element 207 includes an electromagnetic deflector 1116 and an electrostatic deflector 206. A magnetic field of the electromagnetic deflector 1116 is orthogonalized to a magnetic field of the electrostatic deflector 206 so that the deflected chromatic aberration is generated while substantially maintaining a position of the electron beam. In the meantime, the objective deflector 210 defines a position of the electron beam on the sample and generates the deflected chromatic aberration along with the deflection. Therefore, each of the deflectors of the deflected chromatic aberration correcting element 207 is operated in association with the operation of the objective deflector 210 to compensate the deflected chromatic aberration. The electron beam on the sample is two dimensionally deflected so that each of the deflectors of the deflected chromatic aberration correcting element 207 is also two dimensionally deflected.

However, in order to generate the deflected chromatic aberration, the deflection amount of each of the deflectors needs to be large. For this reason, a driving current of the electromagnetic deflector 1116 or a driving voltage of the electrostatic deflector 206 needs to be large. Further, in order to associate with the objective deflector 210, the driving thereof needs to be performed at a high speed with a high precision. Therefore, it is required to reduce the driving voltage or the driving current, that is, improve a deflection sensitivity. Further, when the deflection amount required for each of the deflectors is reduced, the geometric aberration (parasitic aberration) caused by the deflection is also reduced, so that double advantages may be achieved. In addition, reference numeral 201 denotes an electron source, reference numeral 202 denotes an earth electrode, reference numeral 208 denotes an electron trajectory only for electromagnetic deflection, reference numeral 209 denotes an electron trajectory only for electrostatic deflection, reference numeral 211 denotes a secondary electron or a reflection electron, reference numeral 212 denotes a detector, reference numeral 213 denotes an objective lens, reference numeral 214 denotes a condenser lens, and reference numeral 215 denotes a sample.

Figure 12:
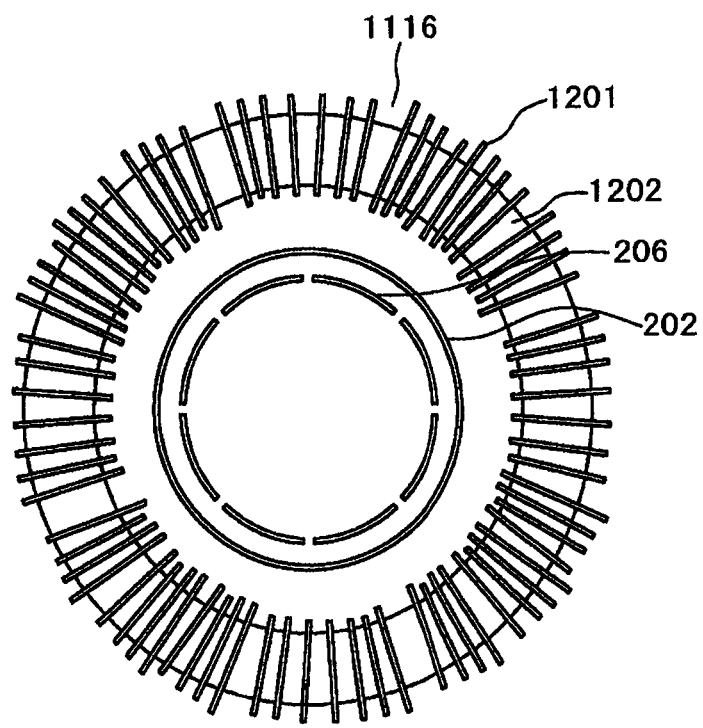
FIG. 12 is a top view of a deflected chromatic aberration correcting element in the electron beam device (scanning electron microscope) according to the first embodiment.

FIG. 12 is a top view of a circumference of the deflector. In the configuration of the electrooptical system of the scanning electron microscope according to the embodiment, the electrostatic deflector 206 is disposed in the electromagnetic deflector 1116 and an offset of the voltage is applied to the electrostatic deflector 206 to reduce a speed of the electron beam. Further, the electrostatic deflector 206 is desirably disposed to form a concentric circle with the electromagnetic deflector 1116. An advantage of the above method is that the electromagnetic deflector 1116 is separated from the electrostatic deflector 206. By doing this, the electromagnetic deflector 1116 may be disposed outside the vacuum so that the deterioration of a degree of a vacuum due to degasification from an electromagnetic coil 1201 which is used for the electromagnetic deflector 1116 or charging-up due to a non-conductive ferrite 1202 may be avoided. Further, the electromagnetic deflector 1116 may be driven at a ground level potential. In the meantime, even though a mechanical error may occur in a relative deflection direction of both deflectors, the geometric aberration (parasitic aberration) due to the mechanical error may be corrected by octupolarizing the electrostatic deflector 206.

The electrostatic deflector 206 is an octupolar deflector in which electrodes are disposed on a circumference and an offset voltage of the electrostatic deflector 206 and a potential of the electron beam match each other as much as possible by disposing the electrodes on the circumference. Further, the earth electrode 202 is inserted between the electrostatic deflector 206 and the electromagnetic deflector 1116. The earth electrode 202 stabilizes potential above and below the electrostatic deflector and serves as a vacuum partition to maintain a vacuum state of an electron beam passage. In addition, the electromagnetic deflector 1116 is configured to be a cosine winding type in order to reduce a multipolar field, which is a known technology. The cosine winding electromagnetic deflector 1116 has a different symmetric property of the geometric structure from the octupolar electrostatic deflector 206. The electromagnetic deflector 1116 of the embodiment adopts a cosine winding which generates only a dipole component and the electrostatic deflector 206 adopts an octupolar deflector which generates a multipolar component and corrects the geometric aberration (parasitic aberration). This is important to reduce the geometric aberration which is generated in accordance with the compensation of the deflected chromatic aberration.

Further, as illustrated in FIG. 11, cylindrical electrodes (an upper control electrode 203 and a lower control electrode 204) which apply a voltage are disposed above and below the electrostatic deflector 206 and apply the same voltage as the offset voltage of the electrostatic deflector 206. In addition, needless to say, a deflected voltage and the offset voltage are applied to the electrostatic deflector. An effect of the electrode is to expand an area where the speed of the electron beam is reduced. A deflected electrical field of the electrostatic deflector 206 is leaked above and below the deflector. Therefore, in order to reduce the speed of the electron beam in the upper and lower areas as much as the offset voltage, more control electrodes need to be disposed above and below the deflector. A leak length of the deflected electric field depends on an inner diameter of the electrostatic deflector and a length of the electrode is set to be larger than the inner diameter to reliably achieve the speed reducing effect. This is also important to improve the precision that compensates a change of the trajectory of the electron beam by the electromagnetic deflector and a change of the trajectory of the electron beam by the electrostatic deflector. Accordingly, a voltage which is applied to the upper and lower control electrodes is desirably substantially equal to the offset voltage which is applied to the electrostatic deflector 206. Further, when the speed of the electron beam is decreased or increased, an electrostatic lens effect may occur. Therefore, in order to separate an electrostatic lens area from an electrostatic deflection area and reduce the geometric aberration (parasitic aberration), it is important to provide long control electrodes up and down. Similarly, a leakage of a magnetic field of the electromagnetic deflector 1116 needs to be considered and a total length of the electrostatic deflector 206, the upper control electrode 203, and the lower control electrode 204 needs to be longer than a total length of the electromagnetic deflectors 1116.

Figure 8:
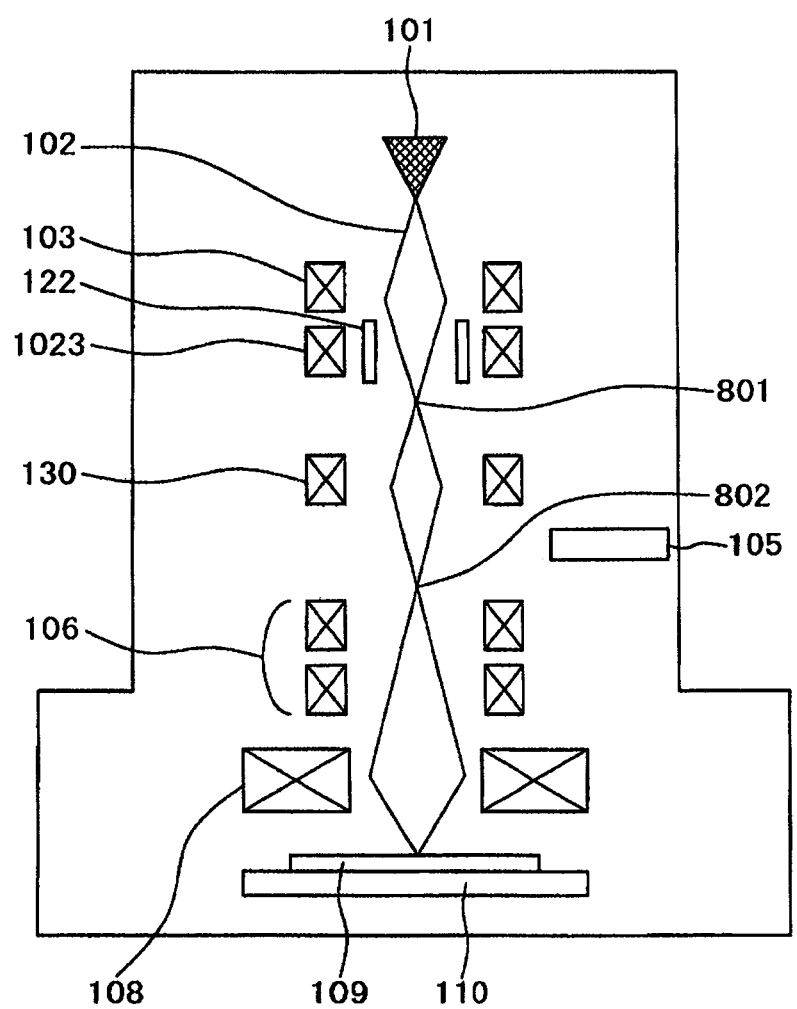
FIG. 8 is an electronic trajectory diagram illustrating diffusion of an electron beam in the electron beam device (scanning electron microscope) according to the first embodiment.

FIG. 8 illustrates distribution of the electron beam in the electron microscope according to the embodiment. A sensitivity for correction of the deflected chromatic aberration largely depends on a distance between the deflected chromatic aberration correcting element (electrostatic deflector 122 and the electromagnetic deflector 1023) and a position of a crossover. In order to optimize a property of the objective lens 108, the location of a second crossover 802 is varied by an energy of the electron beam 102 which is used to observe the sample 109. Accordingly, in order to prevent a property of the deflected chromatic aberration correcting element from being significantly changed, additional deflected chromatic aberration correcting elements (an electrostatic deflector 122 and an electromagnetic deflector 1023) are disposed above the first crossover 801. In other words, the electromagnetic deflector 1023 and the electrostatic deflector 122 are disposed above a lens (the second condenser lens 130) which is disposed above the objective deflector 106 which defines a position of the electron beam. By increasing the sensitivity for correction of the deflected chromatic aberration, a voltage source having a high voltage and a current source having a high current are not necessary and a response delay at the time of deflection depending dynamic correction is improved.

Figure 13:
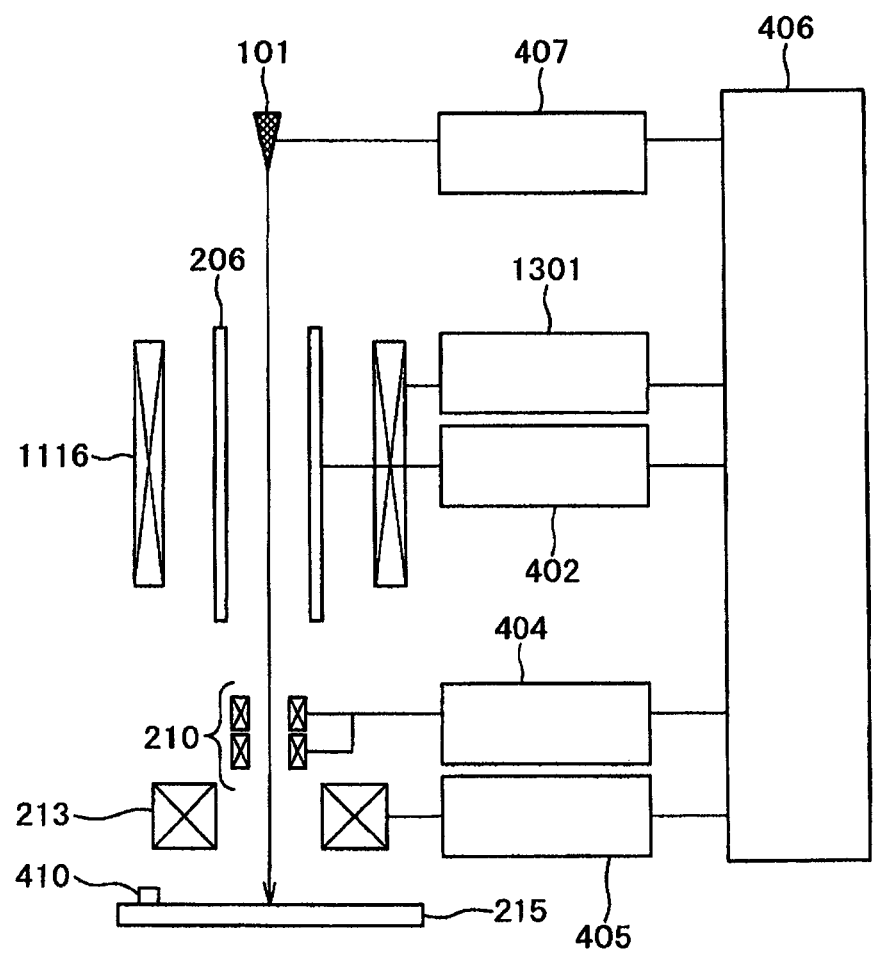
FIG. 13 is a schematic cross-sectional view illustrating a main part of an adjusting means of the electrooptical configuration in the electron beam device (scanning electron microscope) according to the first embodiment.

Next, an adjusting means of the electrooptic configuration of the scanning electron microscope according to the embodiment will be described with reference to FIG. 13. A beam position measuring mark 410 is disposed as a reference mark in order to measure a position of the electron beam on a sample 215. A predetermined intensity is applied to each of the deflectors by an electromagnetic deflector power source 1301 and an offset applied electrostatic deflector power source 402 to measure a change in the position of the electron beam when a minute amount of a voltage of an electron source 101 is changed by an electron source power source 407. By doing this, it is possible to evaluate a correcting capability in the deflected chromatic aberration correcting element (the electrostatic deflector 206 and the electromagnetic deflector 1116). Similarly, the correcting capability may be evaluated by measuring the change in the position of the electron beam when intensities of the electromagnetic deflector power source 1301 and the electrostatic deflector power source 402 are changed at a minute ratio. The same type of evaluation may be utilized in the deflected chromatic aberration property in the objective deflector 210 and the evaluation may be performed by measuring the change in the deflected amount (scanning magnification) and a deflection direction (rotation of the scanning area) of a deflector which defines a position. The deflection by the objective deflector 210 and an operation of the deflected chromatic aberration correcting element may be associated with each other from the above data. Further, reference numeral 213 denotes an objective lens, reference numeral 404 denotes an objective deflector power source, reference numeral 405 denotes an objective lens power source, and reference numeral 406 denotes a digital control system.

In the embodiment, with respect to the electron source voltage of −3 kV, −2 kV is applied as an offset voltage. By operating the deflected aberration correcting elements (the electrostatic deflector 206 and the electromagnetic deflector 1116) in association with the objective deflector, a deterioration of the resolution of the obtained image may be reduced even when an image having a size of 80 μm square is scanned on the sample using the objective deflector. As a result, an image of a large area may be captured without moving the stage so that a throughput in multipoint size measurement is improved 80% or more.

As described above, an electromagnetic deflector is provided above a deflector which defines a position of an electron beam on a sample and an electrostatic deflector having a smaller inner diameter than the electromagnetic deflector, which is capable of applying an offset voltage, is provided so as to overlap the electromagnetic deflector to provide the electron beam device which is capable of suppressing the parasitic aberration caused by the response delay or the deflection and implementing the deflection with a wide viewing field at a high resolution even when the deflected chromatic aberration is corrected.

Further, the electromagnetic deflector and the electrostatic deflector are provided above the lens which is disposed above the objective deflector which defines the position of the electron beam to provide an electron beam device which is capable of easily adjusting the deflected chromatic aberration correcting element (E×B element).

In addition, a means of automatically measuring a change in a position of the beam or a change in a deflected amount (scanning magnification) of a deflector which defines the position and the deflecting direction (rotation of the scanning area) when intensities of the deflectors (the electromagnetic deflector and the electrostatic deflector) are simultaneously and minutely changed or a voltage of an electron source is minutely changed is provided to provide an electron beam device which is capable of suppressing the parasitic aberration caused by deflection and the parasitic aberration caused by the manufacturing process.

Second Embodiment

A second embodiment will be described with reference to FIGS. 1 to 4. Matters which are described in the first embodiment but are not described in this embodiment may be applied to this embodiment unless there are special circumstances.

Figure 1:
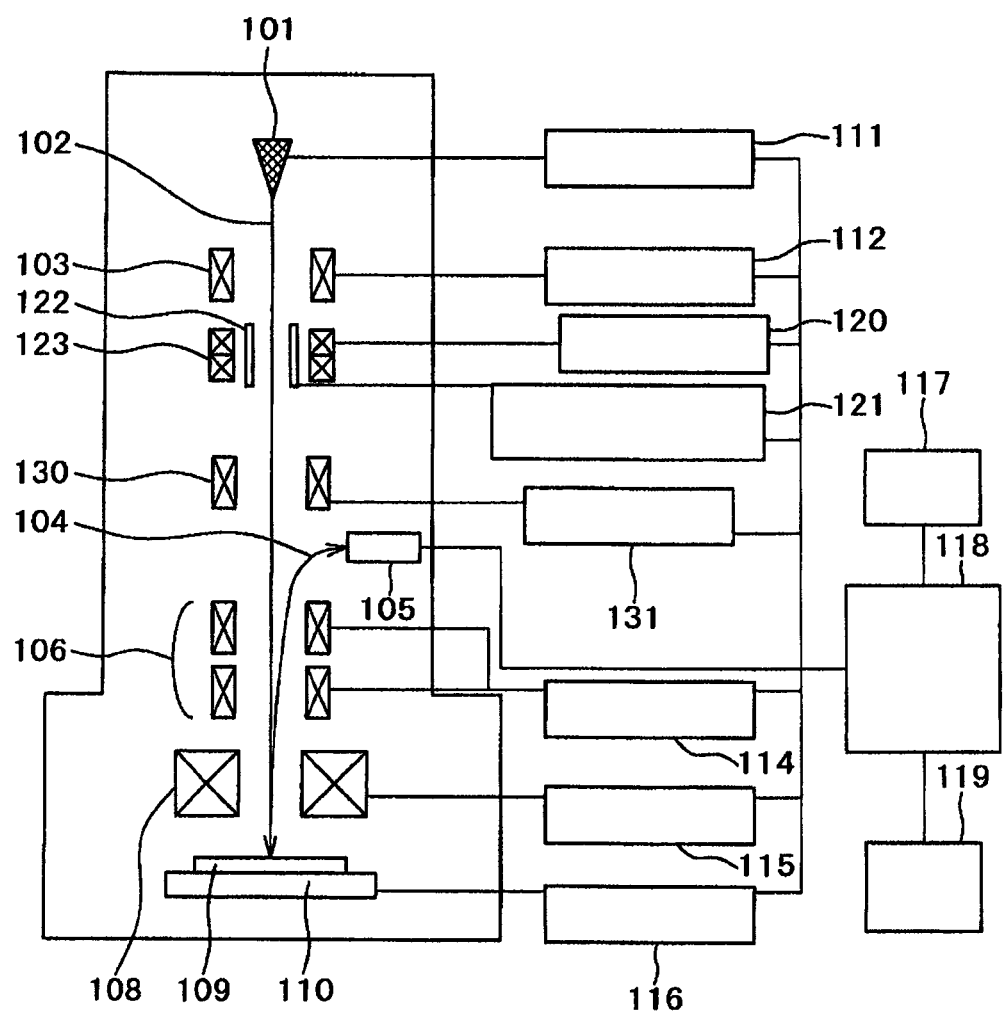
FIG. 1 is a schematic overall configuration view of an electron beam device (scanning electron microscope) according to a second embodiment.
Figure 2:
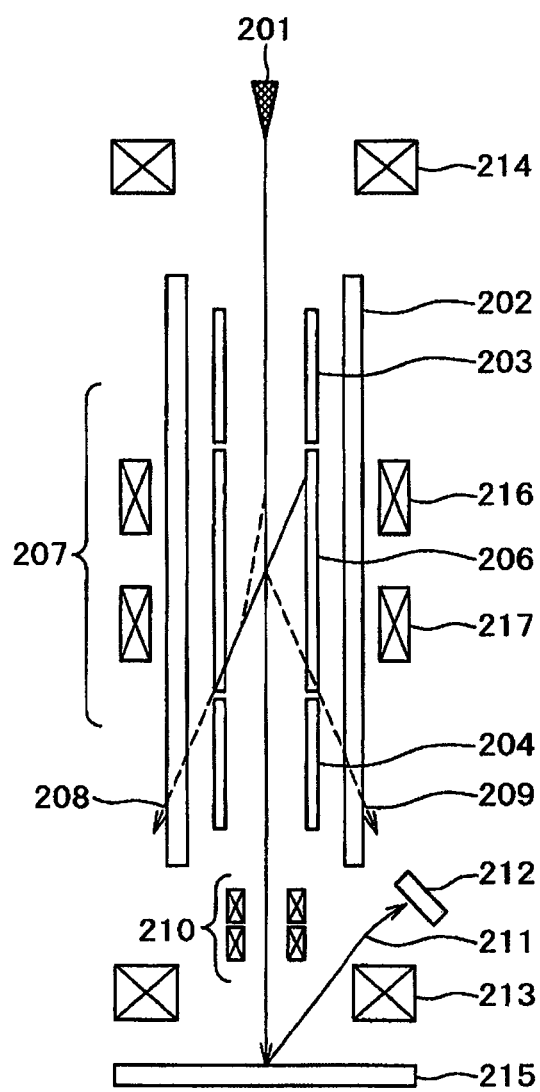
FIG. 2 is a schematic cross-sectional view illustrating a main part of an electrooptical configuration of the electron beam device (scanning electron microscope) according to the second embodiment.

FIG. 1 is a schematic overall configuration view of an electron beam device (scanning electron microscope) according to this embodiment. This embodiment is different from the first embodiment in that an electromagnetic deflector 123 which forms a deflected chromatic aberration correcting element is configured to have a double stage structure. Further, same reference numerals as in FIG. 10 denote the same components. FIG. 2 is a cross-sectional view illustrating a main part for explaining an electrooptical configuration in the scanning electron microscope according to this embodiment. As illustrated in FIG. 2, a deflected chromatic aberration correcting element 207 includes two electromagnetic deflectors 216 and 217 and an electrostatic deflector 206. In addition, same reference numerals as in FIG. 11 denote the same components.

Figure 3:
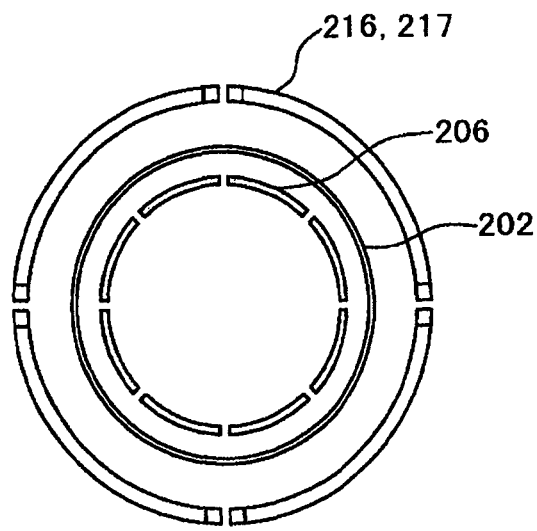
FIG. 3 is a top view of a deflected chromatic aberration correcting element in the electron beam device (scanning electron microscope) according to the second embodiment.

With the double stage structure of the electromagnetic deflector (an upper stage electromagnetic deflector 216 and a lower stage electromagnetic deflector 217), a deflecting point may be adjusted. If the deflecting points of the electromagnetic deflector and the electrostatic deflector do not match, the electron trajectory is shifted from an axis inside the deflected chromatic aberration correcting element so that the geometric aberration (parasitic aberration) is increased. Even though the positions of the electromagnetic deflector and the electrostatic deflector match on the design, the processing or assembling error may occur so that the actual deflecting points do not match. Therefore, any one of the electromagnetic deflector and the electrostatic deflector may have a double stage structure. Both deflectors may have the double stage structure, which is not desirable in consideration of the complex structure or the increased cost. The deflector which has the double stage structure may be two dimensionally deflected and the intensity ratio and the deflection angle may be optimized in order to match the deflecting points. The optimization is performed in order to compensate the influence of the processing or assembling error so that the intensities and the deflection directions of the electromagnetic deflectors at upper and lower stages substantially match. FIG. 3 illustrates a top view of the deflected chromatic aberration correcting element. Also in this embodiment, an octopole deflector is used for the electrostatic deflection.

Figure 4:
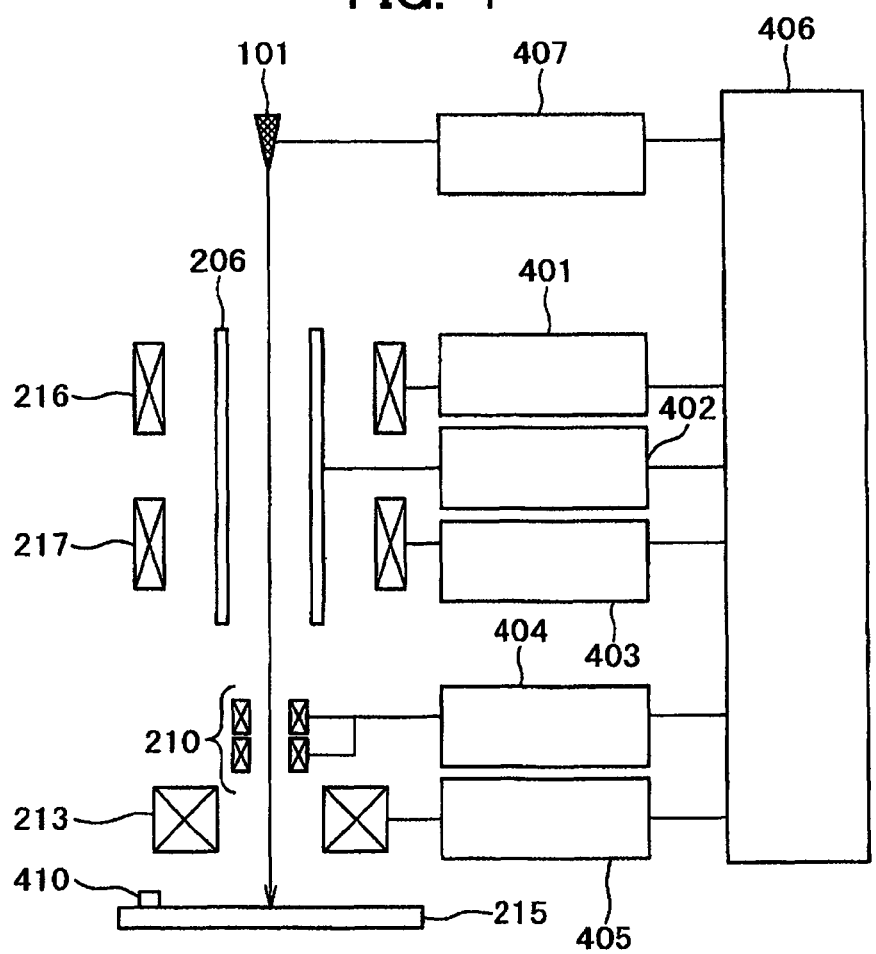
FIG. 4 is a schematic cross-sectional view illustrating a main part of an adjusting means of the electrooptical configuration in the electron beam device (scanning electron microscope) according to the second embodiment.

Next, an adjusting means of the electrooptic configuration of the scanning electron microscope according to the embodiment will be described with reference to FIG. 4. A beam position measuring mark 410 is disposed as a reference mark in order to measure a position of the electron beam on a sample. A predetermined intensity is applied to each of the deflector by a upper stage electromagnetic deflector power source 401, a lower stage electromagnetic deflector power source 403, and the offset applied electrostatic deflector power source 402 to measure a change in the position of the electron beam when a minute amount of a voltage of an electron source is changed by the electron source power source 407. By doing this, it is possible to evaluate a correction capability in the deflected chromatic aberration correcting element. Similarly, the correcting capability may be evaluated by measuring the change in the position of the electron beam when intensities of the upper stage electromagnetic deflector power source 401, the lower stage electromagnetic deflector power source 403, and the electrostatic deflector power source 402 are changed at a minute ratio. The same type of evaluation may be utilized in the deflected chromatic aberration property in the objective deflector 210 and the evaluation may be performed by measuring the change in the deflected amount (scanning magnification) and a deflection direction (rotation of the scanning area) of a deflector which defines a position. The deflection by the objective deflector and an operation of the deflected chromatic aberration correcting element may be associated with each other from the above data.

Further, in order to match the deflecting points in the electromagnetic deflection and the electrostatic deflection, in a state where the movement amounts of the deflections on the sample are compensated, the intensities of the electromagnetic deflection at the upper and lower stages and the deflection direction are adjusted so as to pass the center of the objective lens.

In the embodiment, with respect to the electron source voltage of −3 kV, −2 kV is applied as an offset voltage. By operating the deflected aberration correcting elements in association with the objective deflector, a deterioration of the resolution of the obtained image may be reduced even when an image having a size of 80 μm square is scanned on the sample using the objective deflector. As a result, an image of a large area may be captured without moving the stage (holder) so that a throughput in multipoint measurement is improved 100% or more.

As described above, the same effect as the first embodiment may be obtained in this embodiment.

Further, the electromagnetic deflector has a double stage structure to provide an electron beam device which suppresses the parasitic aberration caused during the manufacturing process and achieves the deflection with a wide viewing field at a high resolution.

Third Embodiment

A third embodiment will be described with reference to FIG. 5. Further, matters which are described in the first or second embodiment but are not described in this embodiment may be applied to this embodiment unless there are special circumstances.

Figure 5:
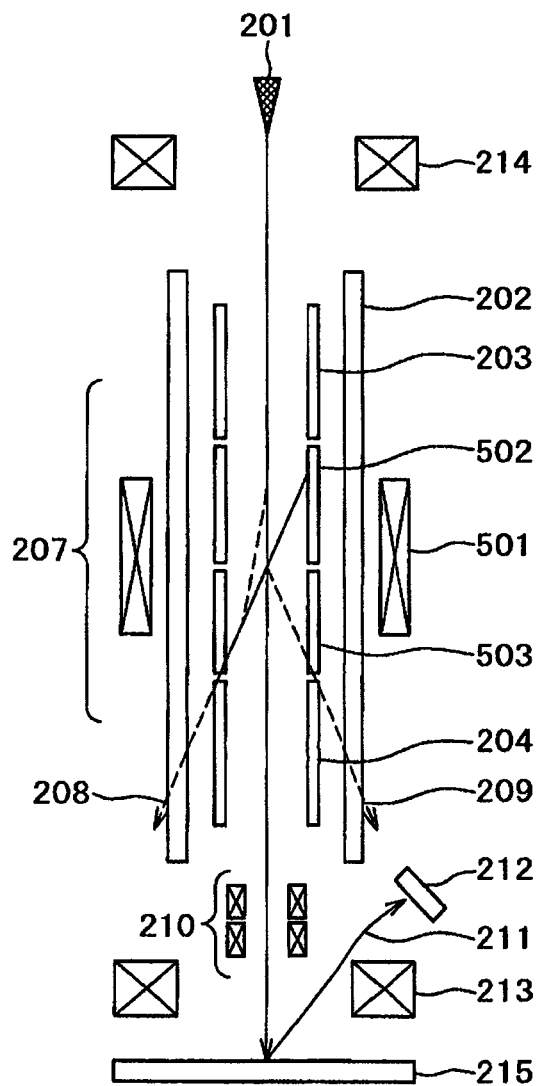
FIG. 5 is a schematic cross-sectional view illustrating a main part of an electrooptical configuration of a scanning electron microscope according to a third embodiment.

FIG. 5 is a schematic cross-sectional view illustrating a main part of an electrooptical configuration of an electron beam device (scanning electron microscope) according to this embodiment. Further, same reference numerals as FIG. 2 denote the same components. In addition, the entire configuration of the scanning electron microscope is substantially same as the first or second embodiment. The difference from the first and second embodiments is that in this embodiment, the electrostatic deflector is configured to have a double stage structure of an upper stage electrostatic deflector 502 and a lower stage electrostatic deflector 503 and the electromagnetic deflector 501 is configured to have a single stage structure. As an effect, the deflecting points may be matched similar to the second embodiment.

In the embodiment, with respect to the electron source voltage of −3 kV, −2 kV is applied as an offset voltage. By operating the deflected aberration correcting elements in association with the objective deflector, a deterioration of the resolution of the obtained image may be reduced even when an image having a size of 80 μm square is scanned on the sample using the objective deflector. As a result, an image of a large area may be captured without moving the stage (holder) so that a throughput in multipoint measurement is improved 100% or more.

As described above, the same effect as the first embodiment may be obtained in this embodiment.

Further, the electrostatic deflector has a double stage structure to provide an electron beam device which suppresses the parasitic aberration caused during the manufacturing process and achieves the deflection with a wide viewing field at a high resolution.

Fourth Embodiment

A fourth embodiment will be described with reference to FIG. 6. Further, matters which are described in any one of the first to third embodiments but are not described in this embodiment may be applied to this embodiment unless there are special circumstances.

Figure 6:
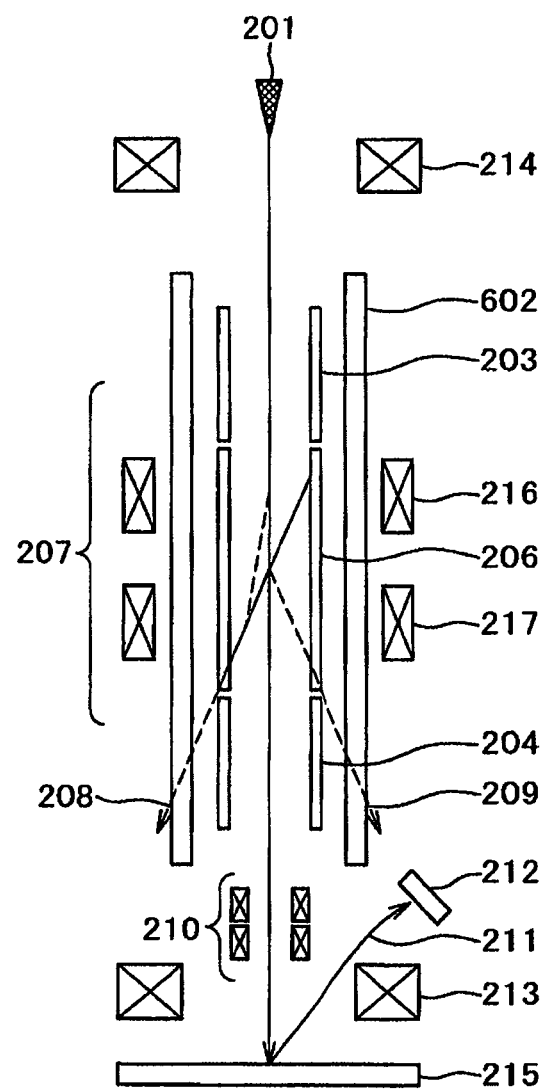
FIG. 6 is a schematic cross-sectional view illustrating a main part of an electrooptical configuration of the electron beam device (scanning electron microscope) according to a fourth embodiment.

FIG. 6 is a schematic cross-sectional view illustrating a main part of an electrooptical configuration of an electron beam device (scanning electron microscope) according to this embodiment. Further, same reference numerals as in FIG. 2 denote the same components. In addition, the entire configuration of the scanning electron microscope is substantially same as the first or second embodiment. A characteristic (difference) of this embodiment is that a voltage applying electrode 602 is provided instead of the earth electrode. The object is to accelerate the electron beam in an area other than the deflected chromatic aberration correcting element 207, which may strengthen the electron beam trajectory from disturbance. The offset voltage which is applied to the electrostatic deflector 206 needs to be determined in consideration of a voltage which is applied to the voltage applying electrode and is also determined in consideration of both the correcting sensitivity and the electrostatic lens effect.

In this embodiment, an electron source voltage is −2 kV and +2 kV is applied to the voltage applying electrode and −1 kV is applied to the electrostatic deflector. As compared with the first embodiment, even though the electrostatic lens effect is increased, the stability of the electron beam trajectory in an area other than the deflected chromatic aberration correcting elements is increased. As a result, in this embodiment, even though a size of 80 μm square is scanned on the sample using the objective deflector, the deflected chromatic aberration may be corrected and an image having a large area may be captured without moving the stage. Therefore, the throughput in the multiple point measurement is improved 80% or more and a reproducibility of length measurement is improved by 0.1 nm.

As described above, the same effect as the second embodiment may be obtained in this embodiment.

Further, the voltage applying electrode is provided between the electromagnetic deflector and the electrostatic deflector so as to accelerate the electron beam in an area other than the deflected chromatic aberration correcting elements and strengthen the electron beam trajectory from the disturbance.

Fifth Embodiment

A fifth embodiment will be described with reference to FIG. 7. Further, matters which are described in any one of the first to fourth embodiments but are not described in this embodiment may be applied to this embodiment unless there are special circumstances.

Figure 7:
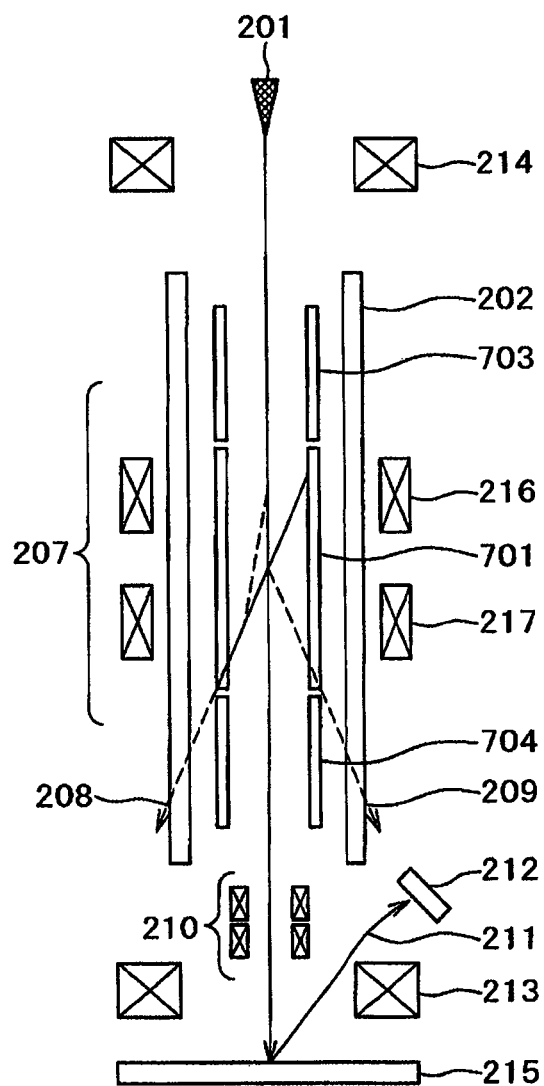
FIG. 7 is a schematic cross-sectional view illustrating a main part of an electrooptical configuration of an electron beam device (scanning electron microscope) according to a fifth embodiment.

FIG. 7 is a schematic cross-sectional view illustrating a main part of an electrooptical configuration of an electron beam device (scanning electron microscope) according to this embodiment. Here, same reference numerals as in FIG. 2 denote the same components. Characteristics of this embodiment are in that the electrostatic deflector 701 functions as both a focal point corrector and an astigmatism corrector. Even though a coma aberration among geometric aberrations (parasitic aberrations) generated by the deflected chromatic aberration correcting element 207 is not corrected, an image plane curvature (focal point deviation) and an astigmatism may be corrected using an appropriate optical element. However, if the correction is performed, for example, in the objective lens 213, it is required to feedback an intensity and the deflection direction of the objective deflector 210, which causes control to become complicated. Therefore, the correction is desirably performed in the deflected chromatic aberration correcting element 207.

As described above, a speed reduced electric field causes the electrostatic lens effect. Therefore, the focal point may be corrected by controlling the electrostatic lens effect. For example, the offset voltage is changed from −3 kV into −3.01 kV to change the focal point on the sample by 10 μm. This is because the focal point sensitivity is improved due to the presence of the offset voltage and if there is no offset voltage, an incomparable voltage is required to correct the same focal point. That is, it is understood that the reduction of the speed of the electron beam is effective for both correction of the deflected chromatic aberration and correction of the focal point. In this case, it is effective to perform the correction on a portion where the potential is significantly changed so that it is effective to change the offset voltage of the upper and lower stage control electrodes 703 and 704, that is, utilize as both the control electrode and the focal point corrector.

Further, the electrostatic deflector is formed of octupolar electrodes, which is similar to the deflector as illustrated in FIG. 12. The voltages may be superimposed so as to generate an electric field having a quadrupolar symmetric property in these electrodes and the astigmatism caused by the quadrupolar field may be corrected. In addition, if the voltages are superimposed so as to generate an electric field having a hexapolar symmetric property in these electrodes, the coma aberration caused by the hexapolar field may be corrected. For example, examples of the voltage which is applied to eight electrodes are as follows. In the case of the deflection, in the clock wise direction, approximately, the voltages are 1:0.4:−0.4:−1:−1:−0.4:0.4:1, in the case of the correction of the astigmatism, the voltages are 1:0:−1:0:1:0:−1:0, and in the case of the correction of the coma aberration, the voltages are −1:1:−0.4:−0.4:1:−1:0.4:0.4. In the case of the correction of the coma aberration, the angle dependence of a high frequency is required for distribution of the voltages of the electrodes so that the polarities of the voltage of an electrode adjacent to an electrode to which a maximum voltage or a minimum voltage required for the correction is applied are inversed. A fact that the hexapolar field is created using an octupolar deflector is an important result in the view point of simplifying the structure of the deflector.

As described above, an optical element of the embodiment is used to correct not only the deflected chromatic aberration, but also the geometric aberration (parasitic aberration) such as the image plane curvature or the astigmatism. A function of a lens correcting the geometric aberration may correct not only the geometric aberration which is generated by the deflected chromatic aberration correcting element but also the image plane curvature or the astigmatism caused by the deflection which defines the position of the beam on the sample at a subsequent stage. This is very effective to implement the deflection with a wide viewing field at a high resolution, which is an object of the present invention.

Figure 9:
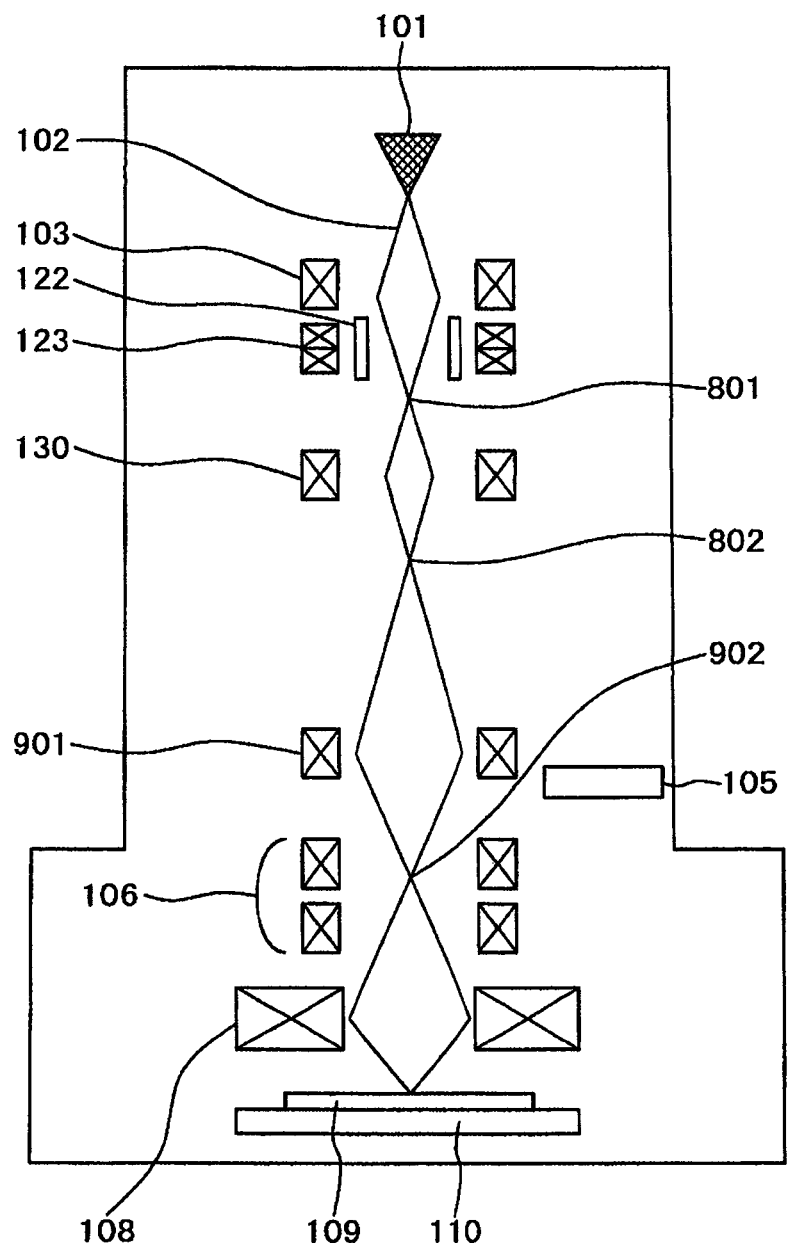
FIG. 9 is an electronic trajectory diagram illustrating diffusion of an electron beam in an electron beam device (scanning electron microscope) according to the fifth embodiment.

Another feature of this embodiment will be described with reference to FIG. 9. The configuration of the entire device of the embodiment is substantially same as that of the first or second embodiment, but one stage of a third condenser lens 901 is added. FIG. 9 is an electron trajectory view for explaining distribution of the electron beam in the scanning electron microscope according to the embodiment. Here, same reference numerals as in FIG. 8 denote the same components. As described above, a sensitivity of the deflected chromatic aberration correcting element (the electrostatic deflector 122 and the electromagnetic deflector 123) significantly depends on a distance from the first crossover 801. Therefore, in this embodiment, the condenser lens is configured to have triple stage structure to fix the distance from the first crossover 801. That is, the position of the crossover which depends on voltage of an electron beam which is applied to the sample or a divergence angle may be changed only by changing a position of a second crossover 802 and a position of a third crossover 902.

In the embodiment, with respect to the electron source voltage of −3 kV, −2 kV is applied as an offset voltage. In addition to the image plane curvature, the astigmatism, and the coma aberration generated in the deflected chromatic aberration correcting element, three aberrations such as a deflected chromatic aberration, an image plane curvature, and an astigmatism which are generated by the deflection on the sample are corrected. As a result, even when an image having a size of 150 μm square is scanned on the sample using the objective deflector, the high resolution may be maintained in the obtained image and the image having a large area may be captured without moving the stage. By doing this, a throughput at the multipoint measurement is improved 120% or more.

As described above, the same effect as the second embodiment may be obtained in this embodiment.

Further, the electrostatic deflector serves as both a focal point corrector and an astigmatism corrector so that the focal point and the astigmatism are corrected in the deflected chromatic aberration correcting element. In addition, a distance between the deflected chromatic aberration correcting element and the crossover position is fixed to constantly maintain a sensitivity of the deflected chromatic aberration correcting element.

Further, the present invention relates to a basic characteristic of the electron beam device. However, the present invention is not limited to the scanning electron microscope but may be widely applicable to the electron beam device such as measurement of a pattern size by the electron beams, detection of the defect or identification of the type of the detect, formation of the pattern, and observation with a wide viewing field.

Sixth Embodiment

Figure 14:
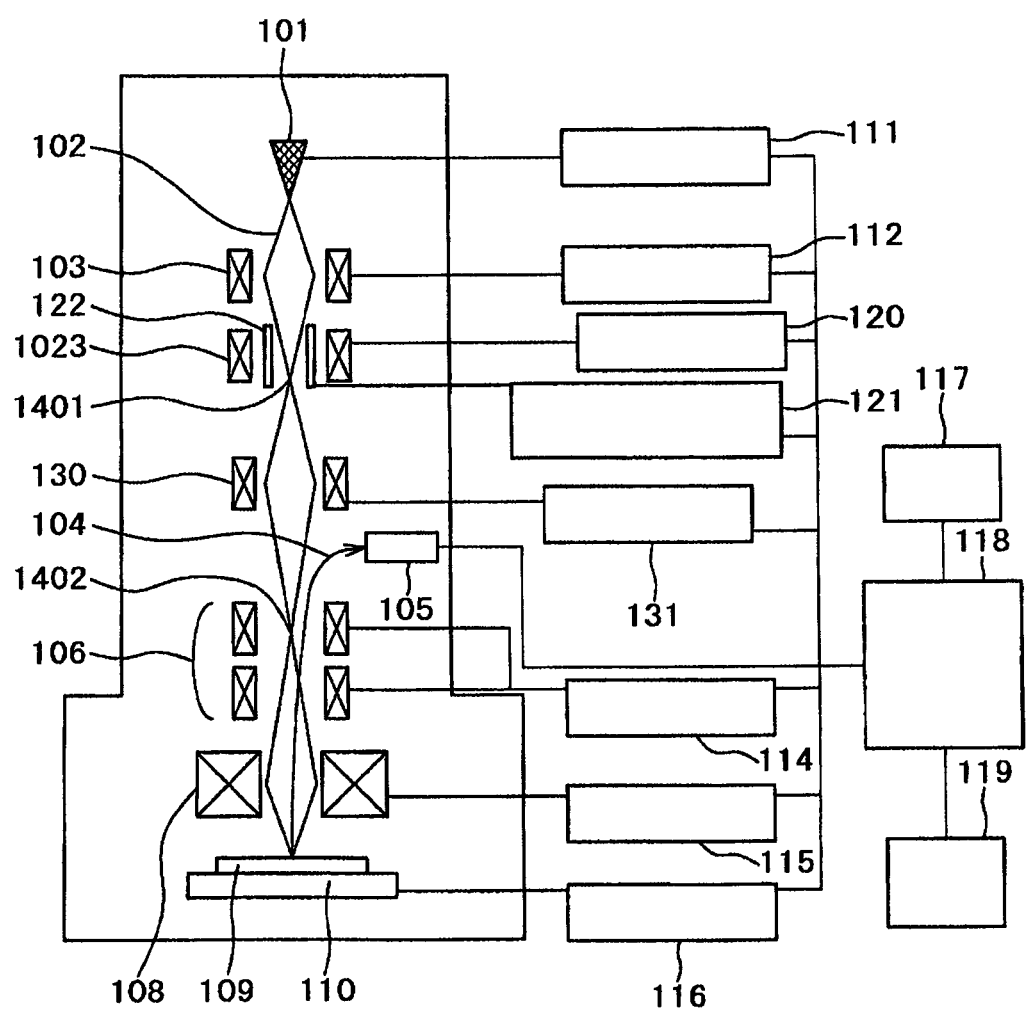
FIG. 14 is a view illustrating a schematic overall configuration and the diffusion of the electron beam of the electron beam device (scanning electron microscope) according to the first embodiment.
Figure 15:
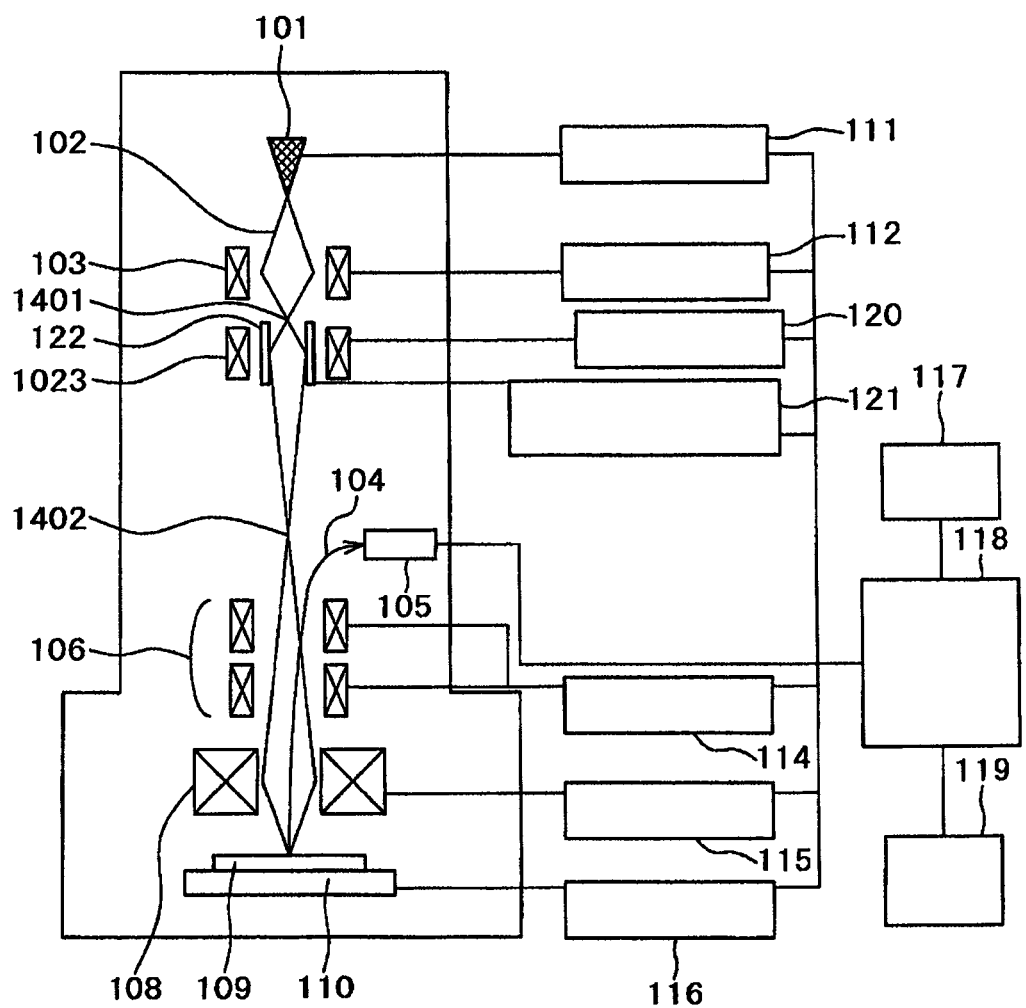
FIG. 15 is a schematic overall configuration view of an electron beam device (scanning electron microscope) according to a sixth embodiment.

This embodiment will be described with reference to FIGS. 14 and 15. FIG. 14 adds the distribution of the electron beam to FIG. 10 and FIG. 15 illustrates the electrooptical system of the embodiment. In FIG. 10, the electron beam 102 emitted from the electron gun is focused by the first condenser lens 103 and the deflected chromatic aberration correcting element. In order to improve the sensitivity of the deflected chromatic aberration correcting element, it is required to apply electrons which are more than half of the voltage of the electron beam 102 as offset and the deflected chromatic aberration correcting element serves as an electrostatic lens. Therefore, in FIG. 10, the electron beam forms an image by the first condenser lens 103 and two lenses of the deflected chromatic aberration correcting element. This has an advantage in that the change of the position of an intermediate image formation 1 by the deflected chromatic aberration correcting element is adjusted by the first condenser lens 103 but the configuration of the device becomes complex. This is similar when the deflected chromatic aberration correcting element is disposed below the second condenser lens 130.

In the meantime, in FIG. 15, the image is formed only by the deflected chromatic aberration correcting element. By adjusting the offset voltage, a sensitivity of correcting the deflected chromatic aberration is improved and a second intermediate image plane 1402 may be formed, which may simplify the electrooptical system. Further, the deflected chromatic aberration correcting element is combined with the first condenser lens 103 (in this case, a first intermediate image plane 1401 is formed between the first condenser lens and the deflected chromatic aberration correcting element) to independently adjust the sensitivity of correcting the deflected chromatic aberration and the position of the intermediate image plane.

As described above, the deflected chromatic aberration correcting element also functions as an electrostatic lens to form an intermediate image, which simplifies the electrooptical system.

Further, the present invention is not limited to the above embodiments but includes various modification embodiments. For example, the above-described embodiments have been described in detail in order to understand the present invention, but the present invention is not limited to an example which includes all described components. In addition, a part of the components of an embodiment may be replaced with a component of other embodiment and the component of an embodiment may be added to the component of the other embodiment. Furthermore, other component may be added to, deleted from, and replaced with a part of the components of each of the embodiments.

As described above, the present invention has been described in detail, but main types of the present invention will be listed as follows.

(1) An electron beam device which includes an electron source and a deflector which defines a position of an electron beam emitted from the electron source on a sample and obtains an image of the sample based on a secondary electronic signal which is generated from the sample by irradiating the electron beam whose position is defined by the deflector, or a signal of a reflection signal electron or an absorbed electron, further includes, a deflected chromatic aberration correcting element including an electromagnetic deflector which is disposed to be closer to the electron source than the deflector with respect to the sample and an electrostatic deflector which is separated from the electromagnetic deflector and has a smaller inner diameter than the electromagnetic deflector, is disposed inside such that a height position from the sample overlaps the electromagnetic deflector and applies an offset voltage.

(2) In the electron beam device disclosed in (1), the electrostatic deflector of the deflected chromatic aberration correcting element also functions as a focal point corrector.

(3) The electron beam device disclosed in (1), further includes upper and lower electrodes which are disposed above and below the electrostatic deflector of the deflected chromatic aberration correcting element and apply a voltage, and the upper and lower electrodes are used as a focal point corrector.

(4) An electron beam device which includes an electron source and a deflector which defines a position of an electron beam emitted from the electron source on a sample and obtains an image of the sample based on a secondary electronic signal which is generated from the sample by irradiating the electron beam whose position is defined by the deflector, or a signal of a reflection signal electron or an absorbed electron, the electron beam device further includes, a deflected chromatic aberration correcting element including an electrostatic deflector which is disposed to be closer to the electron source than the deflector with respect to the sample and an electromagnetic deflector which has a larger inner diameter than the electrostatic deflector, and is disposed inside such that a height position from the sample overlaps the electrostatic deflector, and any one of the electrostatic deflector and the electromagnetic deflector of the deflected chromatic aberration correcting element is configured to have a double stage structure.

(5) In the electron beam device disclosed in (4), the deflected chromatic aberration correcting element adjusts an intensity ratio and a deflection direction of a deflector which has a double stage structure so as to match a deflecting point when a deflector having a double stage structure among the electrostatic deflector and the electromagnetic deflector is interlocked and a deflecting point of the other deflector.

(6) In the electron beam device disclosed in (1) or (4), the electrostatic deflector of the deflected chromatic aberration correcting element functions as a quadrupolar aberration corrector or a hexapolar aberration corrector.

(7) The electron beam device disclosed in (1) or (4), further includes upper and lower electrodes which apply a voltage to upper and lower portions of the electrostatic deflector of the deflected chromatic aberration correcting element and are longer than the inner diameter of the electrostatic deflector.

(8) The electron beam device disclosed in (1) or (4), further includes a grounded conductor or an electrode which applies a voltage between the electrostatic deflector and the electromagnetic deflector of the deflected chromatic aberration correcting element.

(9) In the electron beam device disclosed in (1) or (4), wherein a total length of the electrostatic deflector and the upper and lower electrodes is larger than a total length of the electromagnetic deflector of the deflected chromatic aberration correcting element.

(10) The electron beam device disclosed in (1) or (4), further includes a lens disposed between the deflector which defines a position of the electron beam on the sample and the deflected chromatic aberration correcting element.

(11) An electron beam device which includes an electron source and a deflector which defines a position of an electron beam emitted from the electron source on a sample and obtains an image of the sample based on a secondary electronic signal which is generated from the sample by irradiating the electron beam whose position is defined by the deflector, or a signal of a reflection signal electron or an absorbed electron, the electron beam device further includes, a deflected chromatic aberration correcting element including an electromagnetic deflector which is disposed to be closer to the electron source than the deflector with respect to the sample and an electrostatic deflector which is separated from the electromagnetic deflector and has a smaller inner diameter than the electromagnetic deflector, is disposed inside such that a height position from the sample overlaps the electromagnetic deflector and applies an offset voltage, and a unit that automatically measures a change in the position of the electron beam, or changes in a deflected amount and the deflection direction of the deflectors or both of them when a voltage of the electron source or intensities of the electromagnetic deflector and the electrostatic deflector of the deflected chromatic aberration correcting element are simultaneously and minutely changed.

REFERENCE SIGNS LIST

101 Electron gun (electron source)
102 Electron beam
103 First condenser lens
104 Secondary electron or reflection electron
105 Detector
106 Objective deflector
108 Objective lens
109 Sample
110 Holder (stage)
111 Electron gun controller
112 First condenser lens controller
114 Scanning deflector controller
115 Electromagnetic lens controller
116 Sample voltage controller
117 Storage device
118 Control operating unit of the overall device
119 Display device
120 Electromagnetic deflector controller
121 Offset applied electrostatic deflector controller
122 Electrostatic deflector
123 Electromagnetic deflector
130 Second condenser lens
131 Second condenser lens controller
201 Electron source
202 Earth electrode 203 Upper control electrode
204 Lower control electrode
206 Electrostatic deflector
207 Deflected chromatic aberration correcting element
208 Electron trajectory only for electromagnetic deflection
209 Electron trajectory only for electrostatic deflection
210 Objective deflector
211 Secondary electron
212 Detector
213 Objective lens
215 Sample
216 Upper stage electromagnetic deflector
217 Lower stage electromagnetic deflector
401 Upper stage electromagnetic deflector power source
402 Offset applied electrostatic deflector power source
403 Lower stage electromagnetic deflector power source
404 Objective deflector power source
405 Objective lens power source
406 Digital control system
407 Electron source power source
410 Beam position measuring mark
501 Electromagnetic deflector
502 Upper stage electrostatic deflector
503 Lower stage electrostatic deflector
602 Voltage applying electrode
701 Astigmatism corrector serving as electrostatic deflector and focal point corrector
703 Upper stage control electrode serving as focal point corrector
704 Lower stage control electrode serving as focal point corrector
801 First crossover
802 Second crossover
901 Third condenser lens
902 Third crossover
1023 Electromagnetic deflector
1116 Electromagnetic deflector
1201 Electromagnetic coil
1202 Ferrite
1301 Electromagnetic deflector power source
1401 First intermediate image plane
1402 Second intermediate image plane

The invention claimed is:

1. An electron beam device which includes an electron source and a deflector which defines a position of an electron beam emitted from the electron source on a sample and obtains an image of the sample based on a secondary electronic signal which is generated from the sample by irradiating the electron beam whose position is defined by the deflector, or a signal of a reflection signal electron or an absorbed electron, the electron beam device further comprising:
a deflected chromatic aberration correcting element including an electromagnetic deflector which is disposed to be closer to the electron source than the deflector with respect to the sample and an electrostatic deflector which is separated from the electromagnetic deflector and has a smaller inner diameter than the electromagnetic deflector, is disposed inside such that a height position from the sample overlaps the electromagnetic deflector and applies an offset voltage.

2. The electron beam device according to claim 1, wherein the electrostatic deflector of the deflected chromatic aberration correcting element also functions as a focal point corrector.

3. The electron beam device according to claim 1, further comprising:
upper and lower electrodes which are disposed above and below the electrostatic deflector of the deflected chromatic aberration correcting element and apply a voltage, wherein the upper and lower electrodes are used as a focal point corrector.

4. An electron beam device which includes an electron source and a deflector which defines a position of an electron beam emitted from the electron source on a sample and obtains an image of the sample based on a secondary electronic signal which is generated from the sample by irradiating the electron beam whose position is defined by the deflector, or a signal of a reflection signal electron or an absorbed electron, the electron beam device further comprising:
a deflected chromatic aberration correcting element including an electrostatic deflector which is disposed to be closer to the electron source than the deflector with respect to the sample and an electromagnetic deflector which has a larger inner diameter than the electrostatic deflector, and is disposed inside such that a height position from the sample overlaps the electrostatic deflector,
wherein any one of the electrostatic deflector and the electromagnetic deflector of the deflected chromatic aberration correcting element is configured to have a double stage structure.

5. The electron beam device according to claim 4, wherein the deflected chromatic aberration correcting element adjusts an intensity ratio and a deflection direction of a deflector which has a double stage structure so as to match a deflecting point when a deflector having the double stage structure among the electrostatic deflector and the electromagnetic deflector is interlocked and a deflecting point of the other deflector.

6. The electron beam device according to claim 1, wherein the electrostatic deflector of the deflected chromatic aberration correcting element functions as a quadrupolar aberration corrector or a hexapolar aberration corrector.

7. The electron beam device according to claim 4, wherein the electrostatic deflector of the deflected chromatic aberration correcting element functions as a quadrupolar aberration corrector or a hexapolar aberration corrector.

8. The electron beam device according to claim 1, further comprising:
upper and lower electrodes which apply a voltage to upper and lower portions of the electrostatic deflector of the deflected chromatic aberration correcting element and are longer than the inner diameter of the electrostatic deflector.

9. The electron beam device according to claim 4, further comprising:
upper and lower electrodes which apply a voltage to upper and lower portions of the electrostatic deflector of the deflected chromatic aberration correcting element and are longer than the inner diameter of the electrostatic deflector.

10. The electron beam device according to claim 1, further comprising:
a grounded conductor or an electrode which applies a voltage between the electrostatic deflector and the electromagnetic deflector of the deflected chromatic aberration correcting element.

11. The electron beam device according to claim 4, further comprising:
a grounded conductor or an electrode which applies a voltage between the electrostatic deflector and the electromagnetic deflector of the deflected chromatic aberration correcting element.

12. The electron beam device according to claim 1, wherein a total length of the electrostatic deflector and the upper and lower electrodes is larger than a total length of the electromagnetic deflector of the deflected chromatic aberration correcting element.

13. The electron beam device according to claim 4, wherein a total length of the electrostatic deflector and the upper and lower electrodes is larger than a total length of the electromagnetic deflector of the deflected chromatic aberration correcting element.

14. The electron beam device according to claim 1, further comprising:
a lens disposed between the deflector which defines a position of the electron beam on the sample and the deflected chromatic aberration correcting element.

15. The electron beam device according to claim 4, further comprising:
a lens disposed between the deflector which defines a position of the electron beam on the sample and the deflected chromatic aberration correcting element.

16. An electron beam device which includes an electron source and a deflector which defines a position of an electron beam emitted from the electron source on a sample and obtains an image of the sample based on a secondary electronic signal which is generated from the sample by irradiating the electron beam whose position is defined by the deflector, or a signal of a reflection signal electron or an absorbed electron, the electron beam device further comprising,
a deflected chromatic aberration correcting element including an electromagnetic deflector which is disposed to be closer to the electron source than the deflector with respect to the sample and an electrostatic deflector which is separated from the electromagnetic deflector and has a smaller inner diameter than the electromagnetic deflector, is disposed inside such that a height position from the sample overlaps the electromagnetic deflector and applies an offset voltage, and
a unit that automatically measures a change in the position of the electron beam, or changes in a deflected amount and the deflection direction of the deflectors or both of them when a voltage of the electron source or intensities of the electromagnetic deflector and the electrostatic deflector of the deflected chromatic aberration correcting element are simultaneously and minutely changed.

* * * * *